United States Patent [19]

Long et al.

[11] 3,764,790

[45] Oct. 9, 1973

[54] TECHNIQUE FOR EXTENDING THE FREQUENCY RANGE OF DIGITAL DIVIDERS

[75] Inventors: Walt C. Long, Hampton; Joan H. Middleton, Newport News, both of Va.

[73] Assignee: The United States of America as represented by the Administrator of the National Aeronautics and Space Administration, Washington, D.C.

[22] Filed: Mar. 30, 1972

[21] Appl. No.: 239,573

[52] U.S. Cl. ....... 235/152, 235/92 CA, 235/92 DM, 307/225 R, 328/48, 235/150.3

[51] Int. Cl. ........ G06f 7/39

[58] Field of Search ........ 235/152, 150.3, 92 CP, 235/92 FQ, 92 CA, 92 DM, 92 PL; 307/225 R, 225 B, 225 C, 226 R, 226 B, 226 C; 328/48

[56] References Cited

UNITED STATES PATENTS

| | | | |
|---|---|---|---|
| 3,456,200 | 7/1969 | Bos | 307/226 X |
| 3,594,551 | 7/1971 | Shearer et al. | 235/92 PL |
| 3,147,442 | 9/1964 | Fritzsche et al. | 328/48 X |
| 3,369,183 | 2/1968 | Mester | 328/48 |
| 3,378,697 | 4/1968 | Preston et al. | 307/226 X |

*Primary Examiner*—Malcolm A. Morrison
*Assistant Examiner*—James F. Gottman
*Attorney*—Howard J. Osborn et al.

[57] ABSTRACT

A technique for extending the frequency range of a presettable digital divider. The conventional digital divider consists of several counter stages with the count of each stage compared to a preselected number. When the counts for all stages are equal to the preselected numbers, an output pulse is generated and all stages are reset. For high input frequencies, the least significant stage of the divider has to be reset in a very short time. This limits the frequency that can be handled by the conventional digital divider. This invention provides a technique in which the second least significant and higher stages are reset and the least significant stage is permitted to free-run. Hence, the time in which the reset operation can be performed is increased thereby extending the frequency range of the divider.

4 Claims, 2 Drawing Figures

TECHNIQUE FOR EXTENDING THE FREQUENCY RANGE OF DIGITAL DIVIDERS

ORIGIN OF THE INVENTION

The invention described herein was made by employees of the United States Goverment and may be manufactured and used by or for the Government for governmental purposes without the payment of any royalties thereon or therefor.

BACKGROUND OF THE INVENTION

The invention relates generally to presettable digital dividers and more specifically concerns a method and apparatus for extending the frequency range of the conventional presettable digital dividers. The conventional digital divider having several decades counts input pulses until some preselected number, N, is reached at which time an output is generated, the divider is reset and the count begins again. Consequently, if the frequency of the input pulses is F, the frequency of the output is F/N. The conventional digital divider works well at low input frequencies. However, for high input frequencies special nanosecond logic is required to perform the reset function. For example, if the input frequency F is 100 MHz, the maximum time allowable for resetting the first decade of the divider is one-hundred MHz or 10 nanoseconds.

The primary purpose of this invention is to increase the allowable time for resetting a digital divider thereby extending its frequency range.

SUMMARY OF THE INVENTION

For purposes of explaining theory of this invention, assume that a divider with four decades in cascade is used to divide frequencies up to 150 MHz. Normally, each decade has gating associated with it for decoding the count and selecting the number each must reach before an output is generated. If N = WXYZ is selected by some input device, then 1,000W + 100X + 10Y + Z input pulses are to be counted before there is an output and the decades are reset. However, in this system, in order to avoid having to use sub-nanosecond logic to accomplish the reset operation in the short time available, only the second and succeeding decades are reset. The first decade is permitted to cycle through its 10 states continuously. With the latter operating as a fixed divide-by-ten, the divider normally could only be changed in minimum steps of 10. However, additional control circuitry associated with the first decade is used to permit changing N in unit steps. The least significant digit of N, Z, represents the number of additional pulses which must be counted after the second, third, and fourth decades have reached their count.

The addition of Z pulses is accomplished by increasing the selected count for the second decade, Y, by one and subtracting from the final count of the second and succeeding decades the tens complement of Z. Thus, the number of pulses counted will 1,000W + 100X + 10(Y + 1) − (10 − Z). The net result is exactly the desired number of pulses, N. For example, if N = 2,546, the fourth decade count to 2, the third decade to 5, and the second decade to 4 + 1 or 5. In order to satisfy the count on the latter three decades, 2,550 pulses would have to be input to the divider. However, if the first decade control circuitry permitted 4 less than this number of pulses to be input, then 2,546 pulses would actually be counted. The timing or spacing of the clock pulses from the first decade to the second decade is controlled. For a selected number of times during each complete count of N pulses, the first decade, through the control circuitry, delivers a clock pulse to the second decade once for every nine input pulses. The number of times this occurs is equal to 10-Z, where Z is the selected count of the first decade. During the rest of the count, the clock pulse to the second decade is controlled to occur once for every 10 input pulses which is the normal operation. In the example above, after Y is increased by one, 255 clock pulses to the second decade are required to satisfy the selected count on the second, third, and fourth decades. Since four (10 − Z) of these clock pulses are spaced nine input pulses apart, then (9 × 4) + (10 × 251) = 2,546 pulses are actually counted. In effect, four pulses have been subtracted from the final count of the last three decades. The divide-by-nine operation can take place any time during the count cycle. We need only detect when the second and succeeding decades achieve their selected count to get an output.

DETAILED DESCRIPTION OF THE INVENTION

Figure 1:
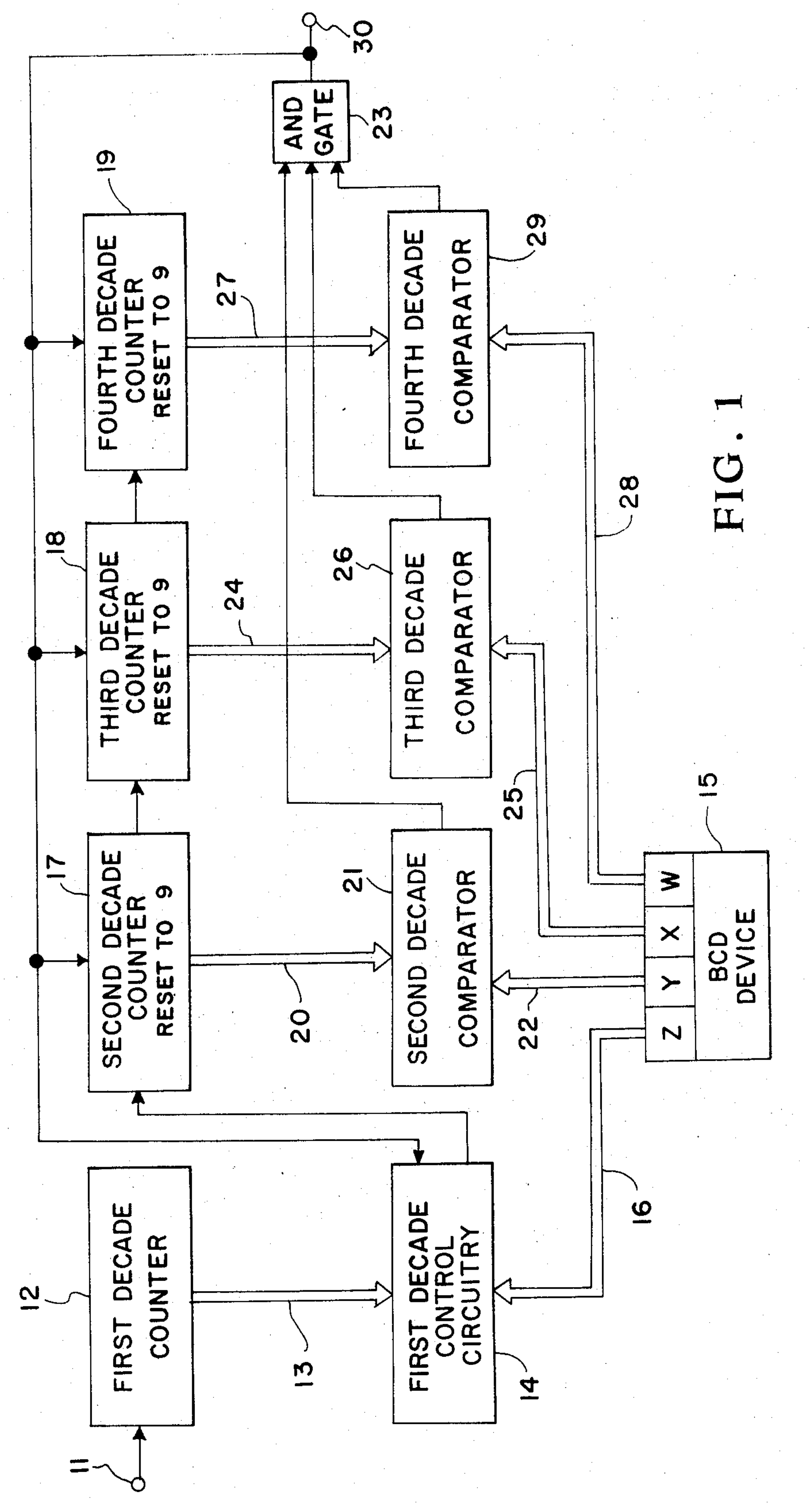
FIG. 1 is a block diagram of a preferred embodiment of this invention.

Turning now to the embodiment of the invention selected for illustration in the drawings, the number 11 in FIG. 1 designates the input terminal to which the input pulses, having a frequency F, are applied. These input pulses are counted by a first decade counter 12 which counts up. The count on counter 12 appears on parallel lines 13 that are connected to first decade circuitry 14. The details of control circuitry 14 is disclosed in FIG. 2. A binary coded decimal (BDC) device 15 has the number N = 1,000W + 100X + 10Y + Z set into it. The least significant digit Z of N is applied over parallel lines 16 to first decade control circuitry 14. Each time, for 10−Z times nine pulses are applied to counter 12, control circuitry 14 produces a pulse that is applied to a second decade counter 17. Thereafter control circuitry 14 produces a pulse that is applied to counter 17 each time ten pulses are applied to counter 12. Connected in cascade with counter 17 are a third decade counter 18 and a fourth decade counter 19. Whenever counters 17, 18 and 19 are reset they are all reset to nine. Consequently, the counter registered on counters 17, 18 and 19 at any given instant is equal to the number of pulses minus one applied to counter 17 from control circuitry 14. The count on counter 17 appears on parallel lines 20 which are applied to a second decade comparator 21. The digit Y set into BCD 15 is applied over parallel lines 22 to comparator 21. Whenever the count on lines 20 is equal to the count on lines 22, comparator 21 produces a pulse which is applied to an AND gate 23. The count on counter 18 and the digit X are applied over parallel lines 24 and 25, respectively, to a third decade comparator 26 which applies a pulse to gate 23 whenever the two are equal. The count on counter 19 and the digit W are applied over parallel lines 27 and 28, respectively, to a fourth decade counter 29 which applies a pulse to gate 23 whenever the two are equal. Whenever comparators 21, 26 and 29 produce pulses that are simultaneously applied to gate 23, a pulse is produced at an output terminal 30. Each pulse produced at output terminal 30 is applied to control circuitry 14 and counters 17, 18 and 19 to reset them. Consequently, if the frequency of the input pulses applied to input terminal 11, is F, the frequency of the pulses produced at output terminal 30 is F/N where N = 1,000W + 100X + 10Y + Z.

Figure 2:
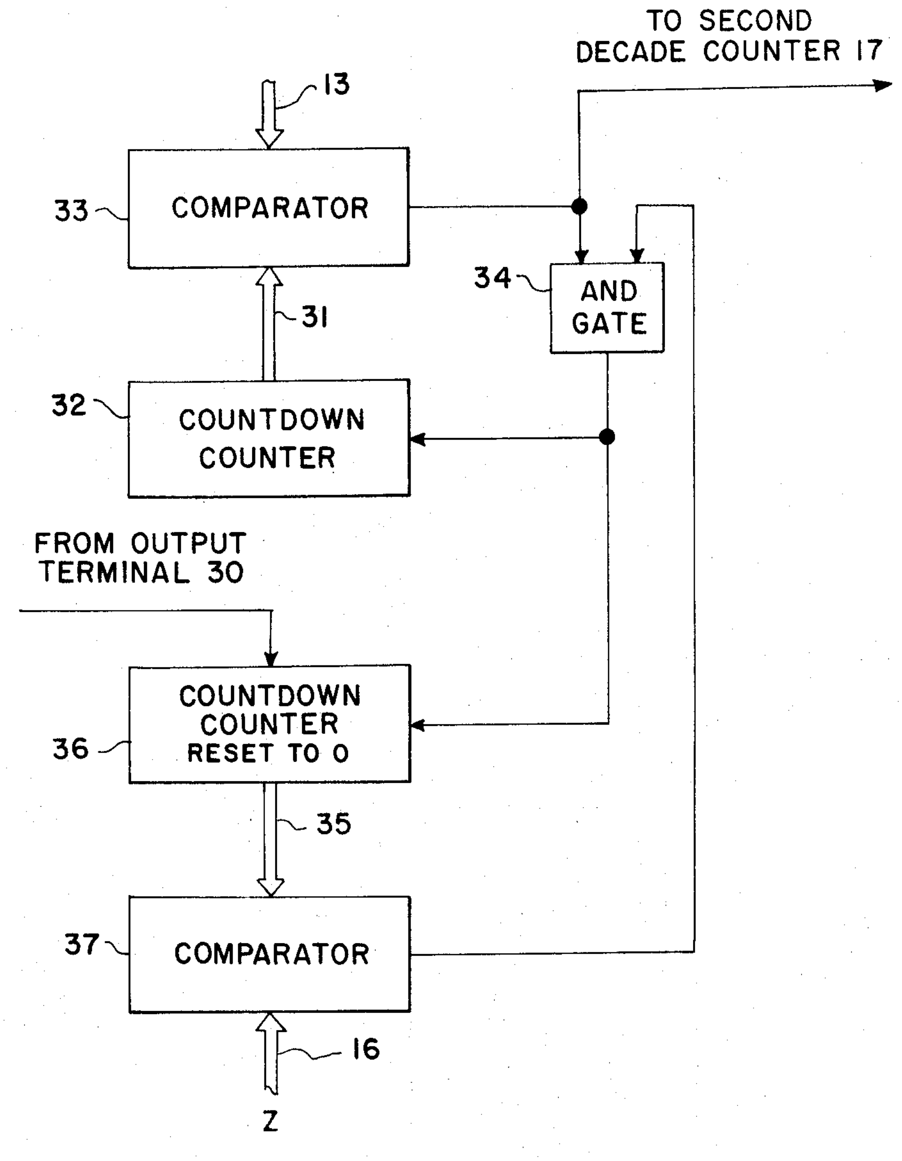
FIG. 2 is a block diagram of the first decade control circuity shown in FIG. 1.

Referring to FIG. 2, there is shown in more detail the first decade control circuitry 14 in FIG. 1. The count on parallel lines 13 is compared with the count on parallel lines 31 from a countdown counter 32 by means of a comparator 33. Whenever the two counts are the same, comparator 33 produces a pulse which is applied to second decade counter 17 and to an AND gate 34. The digit Z on parallel lines 16 is compared with the count on parallel lines 35 from a countdown counter 36 by means of a comparator 37. Whenever the values on parallel lines 16 and 35 are equal, comparator 37 produces an inhibit signal that blocks gate 34, and whenever these two values are unequal, comparator 37 produces an enabling signal that allows the pulses from comparator 33 to pass through gate 34. The pulses that pass through gate 34 are applied to counters 32 and 36. Each pulse produced at output terminal 30 is applied to counter 36 to reset it to zero. The counters, comparators, AND gates and BCD device used in this invention are well known; hence, they are not disclosed in detail in this application.

In describing the operation of the embodiment of the invention disclosed in FIGS. 1 and 2, it will be assumed that the frequency of the input pulses applied to terminal 11 is F, that counters 17, 18, 19 and 36 are reset and that the number N set into BCD device 15 is 2,546. Hence, Z=6 appears on lines 16, Y=4 appears on lines 22, X=5 appears on lines 25 and W=2 appears on lines 28. When the count on lines 13 increases to the count on counter 32 and lines 31, comparator 33 produces a pulse. This pulse is applied through gate 34 and decreases by one the counts on counters 32 and 36. Consequently, after nine more input pulses are applied to counter 12, the counts on lines 13 and 31 are the same and comparator 33 produces another pulse. This continues until 10–Z pulses are produced by comparator 33 at which time the count on lines 35 is equal to the count on lines 16 causing comparator 37 to produce an inhibit signal that blocks gate 34. Thereafter, comparator 33 produces a pulse for each 10 input pulses until counter 36 is reset. For the example N = 2,546, 10 − Z = 4 which means that the first 4 × 9 = 36 input pulses causes the comparator 33 to produce four pulses. These four pulses cause the count on counter 17 to be three and the counts on counters 18 and 19 to be zero. Therefore, since each count on counter 17 represents ten input pulses, 2,510 more input pulses are required for the comparators 21, 26 and 29 to simultaneously produce pulses. These pulses cause an output pulse to be produced which resets counter 17, 18, 19 and 36. Inasmuch as 36 + 2,510 = 2546 input pulses are required to produce each output pulse, the output frequency is F/2,546. Since in the operation of this invention counter 12 does not have to be reset, the reset time is not critical. The shortest allowable reset time is the time for resetting counters 17 and 36. This time is 10/F. Whereas if counter 12 had to be reset, it would have to be reset in 1/F.

The advantages of this invention are that it increases the allowable time for resetting the counters used in digital dividers.

It is to be understood that the form of the invention herewith shown and described is to be taken as a preferred embodiment. Various changes may be made without departing from the spirit or scope of the invention as described in the subjoined claims. For example, equivalent elements may be substituted for those illustrated and described, more or fewer than four decades or stages could be used, a base B other than 10 could be used in which case $N = B^3W + B^2X + B(Y+1) - (B-Z)$, or a mixed base could be used. That is, for example, the base of the first stage could be 20, the base of the second and third stages could be 10 and the base of the fourth stage could be 2. If a base other than B = 10, for example a base B = 8, is used then all that is necessary is to make all of the counters base 8 counters instead of base 10 counters. Then counters 17, 18 and 19 would each reset to seven instead of to nine.

What is claimed is:

1. A digital divider for producing output pulses having a frequency F/N where F is the frequency of the input pulses to the divider and N is a preselected multidigit number with the least significant digit Z of N being to the base B, comprising:

- means for producing signals representing each of the digits of said number N;
- first counter means having B states, receiving said input pulses and in response thereto continuously recycling through its B states, for producing signals indicative of its states at all times;
- control circuit means receiving the signals representing Z and the signals indicative of the states of said first counter means for producing a pulse each time B−1 input pulses are received by said first counter means until B–Z pulses are produced and thereafter producing a pulse each time B input pulses are received by said first counter means until a reset pulse is received by the control circuit means;
- second counter means for counting the pulses produced by said control circuit means and for producing signals indicative of the count minus one;
- comparator means for comparing the signals produced by said second counter means with said signals representing each of the digits of said number N except Z and for producing an output pulse whenever the signals are equal; and
- means for applying each of said output pulses to said control circuit means and said second counter means to reset them whereby said output pulses have a frequency F/N and a time of B/F is allowable for said reset operation.

2. A digital divider according to claim 1 wherein said control circuit means comprises:

- third counter means having B states which counts down one each time a pulse is applied to it including means for producing signals indicative of the count on the counter;
- fourth counter means having B states which counts down one each time a pulse is applied to it and which resets to zero each time one of said output pulses is applied to it including means for producing signals indicative of the count on the counter;
- an AND gate having its output connected to said third and fourth counters;

second comparator means for comparing said signals representing Z and said signals representing the count on said fourth counter means for applying an enabling signal to said AND gate while said signals are different and for applying an inhibit signal to said AND gate while said signals are equal; and third comparator means for comparing said signals indicative of the states of said first counter means with said signals indicative of the count on said third counter means for applying a pulse each time the signals are equal to said second counter means and to said AND gate.

3. In a digital divider for producing output pulses having a frequency F/N where F is the frequency of the input pulses to the divider and N is a preselected multi-digit number with the least significant digit Z of N being to the base B;

means for producing signals representing Z;

first counter means having B states, receiving said input pulses and in response thereto continuously recycling through its B states for producing signals indicative of its states at all times; and control circuit means receiving the signals representing Z and the signals indicative of the states of said counter means for producing a pulse each time B−1 input pulses are received by said counter means until B−Z pulses are produced and thereafter producing a pulse each time B input pulses are received by said counter means until a reset pulse is received by the control circuit means.

4. In a digital divider according to claim 3 wherein said control circuit means comprises:

second counter means having B states which counts down one each time a pulse is applied to it including means for producing signals indicative of the count on the counter;

third counter means having B states which counts down one each time a pulse is applied to it and which resets to zero each time a reset pulse is applied to it including means for producing signals indicative of the count on the counter;

an AND gate having its output connected to said second and third counters;

first comparator means for comparing said signals representing Z and said signals representing the count on said third counter means for applying an enabling signal to said AND gate while said signals are different and for applying an inhibit signal to said AND gate while said signals are equal; and second comparator means for comparing said signals indicative of the states of said first counter means with said signals indicative of the count on said second counter means for applying a pulse each time the signals are equal to said AND gate.

* * * * *